United States Patent [19]

Speigel

[11] Patent Number: 4,647,519

[45] Date of Patent: Mar. 3, 1987

[54] NEGATIVE-WORKING PHOTORESIST METHOD OF MAKING REAR-PROJECTION TELEVISION SCREEN VIEWING SURFACE

[75] Inventor: Kenneth Speigel, Seneca Falls, N.Y.

[73] Assignee: North American Philips Consumer Electronics Corp., New York, N.Y.

[21] Appl. No.: 775,966

[22] Filed: Sep. 13, 1985

Related U.S. Application Data

[62] Division of Ser. No. 525,908, Aug. 24, 1983, Pat. No. 4,556,626.

[51] Int. Cl.⁴ .................. G03C 5/00; G03B 21/60
[52] U.S. Cl. ......................... 430/25; 430/274; 430/289; 430/946; 350/128
[58] Field of Search ............ 430/25, 946, 274, 289; 350/128

[56] References Cited

U.S. PATENT DOCUMENTS

| | | | |
|---|---|---|---|
| 3,317,319 | 5/1967 | Mayaud | 430/25 |
| 3,471,294 | 10/1969 | Van der Sanden et al. | 430/289 |
| 3,523,717 | 8/1970 | Glenn | 350/128 |
| 3,558,310 | 1/1971 | Mayaud | 430/25 |
| 3,598,640 | 10/1971 | Bennett | 428/149 |
| 3,832,032 | 8/1974 | Shimada | 350/128 |
| 4,172,219 | 10/1979 | Deml et al. | 350/128 |
| 4,431,720 | 2/1984 | Sugarman | 430/157 |
| 4,525,029 | 6/1985 | Inoue et al. | 350/128 |
| 4,556,626 | 12/1985 | Spiegel | 430/289 |

*Primary Examiner*—Charles L. Bowers, Jr.
*Attorney, Agent, or Firm*—Norman N. Spain

[57] ABSTRACT

A method is shown in which a black, light-absorbing matrix is formed on the viewing surface of a rear-projection polymethyl methacrylate TV viewing screen in which there is use of a negative working photoresist composition comprising an aqueous solution of polyvinyl alcohol, a water-soluble dichromate and acetone as essentially the sole wetting agent.

5 Claims, 5 Drawing Figures

NEGATIVE-WORKING PHOTORESIST METHOD OF MAKING REAR-PROJECTION TELEVISION SCREEN VIEWING SURFACE

This is a division of application Ser. No. 525,908, filed Aug. 24, 1983, U.S. Pat. No. 4,556,626.

BACKGROUND OF THE INVENTION

This invention relates to a novel negative working photoresist composition particularly suitable for use on methyl methacrylate polymer substrates and to a method of forming a photoresist on a methyl methacrylate polymer substrate. Further, this invention also relates to a photolithographic method for forming a black light-absorbing matrix on polymethyl methacrylate rear-projection TV viewing screens.

In general there are two methods known in the art for providing methyl methacrylate polymer substrates such as polymethyl methacrylate with a light sensitive photoresist layer. One of these methods involves the use of a polyvinyl alcohol (PVA) negative acting photoresist composition containing water and/or alcohol solvents such as that described in U.S. Pat. Nos. 3,558,310 and 3,922,395.

More particularly U.S. Pat. No. 3,558,310 shows a photolithographic method of producing a light-absorbing matrix on the glass face plate of a color television picture tube. In the method described, the surface of the face plate, after being cleaned, is coated with a photosensitive layer, the solubility of which is altered by exposure to light, by applying to the surface of a face plate an aqueous solution of polyvinyl alcohol and ammonium dichromate and, after drying the layer, exposing the layer to ultraviolet light rays through a mask in three different positions, each position coinciding with desired phosphor locations. Each exposure causes the exposed areas to harden and become water-insoluble.

However this method does not yield good results when applied to polymethyl methacrylate screens because of the poor ability of the polyvinyl alcohol aqueous solution to wet the surface of the polymethyl methacrylate screen.

The addition of a wetting agent allows a negative-working aqueous polyvinyl alcohol photoresist composition to adequately wet the surface of a polymethyl methacrylate substrate. However, the wetting agent remains in the dried photoresist layer as a result of which the supported water-insoluble unsaturated portions of the exposed areas of the photoresist layer may still remain sufficiently water soluble to be removed during development with water. The addition of the wetting agent to the aqueous polyvinyl alcohol photoresist compositions is therefore of little value when the photoresist compositions are used to provide sharply defined patterns on a methyl methacrylate polymer substrate such as is required, for example, for the formation of a black light-absorbing matrix on polymethyl methacrylate rear-projection TV viewing screens.

Another known process employs an all organic photoresist composition such as Kodak Thin Film Resist (KTFR) in which the solvent is xylene. However, while this organic composition adequately wets the surface of a methyl methacrylate polymer substrate and allows precise patterns to be formed on a methyl methacrylate polymer substrate, the use of a composition employing an organic solvent such as xylene introduces other problems as such a composition has all the disadvantages inherent in the use of organic compositions, such compositions being toxic, flammable or explosive and expensive. Thus when employing such compositions special precautions are required such as the use of expensive exhaust systems, face masks and explosive-proof rooms.

As has already been stated, an additional aspect of the instant invention relates to a method for the formation of a black light-absorbing matrix on a polymethyl methacrylate rear-projection TV viewing screen.

In a commonly employed type of such a viewing screen, one surface is entirely covered with contiguous longitudinal, lenticules each lenticule being about 40 mils in width. The television picture is projected on the lenticular side of the screen and is seen as a "focussed" picture on the viewing side. The "focussed" picture, when examined closer, is shown to consist of a series of narrow bright stripes each opposite the center line of a lenticule alternating with a series of dark, unlit areas.

In order to enhance the picture contrast and reduce reflection of ambient light to the viewer, the unlit areas between the bright stripes are coated with a black light-absorbing material. Such a material, while reducing reflection of the ambient light, does not substantially reduce the brightness of the picture.

In one manufacturing process, the entire viewing side of the screen is grooved with longitudinal grooves positioned so as to coincide with the bright stripes of the "focussed" picture. The raised ridges between the grooves which extend up from the screen are contact printed with a black ink to thereby produce a black matrix covering all unlit areas of the picture.

Although the screens produced by this contact printing method are commercially useful there is room for improvement. The black stripes made by the contact process have ragged or scalloped edges, rather than straight edges because of the lack of precision inherent in the contact process. The "window" stripe width, that is the areas of the picture may vary from one area to another for the same reason. Further, the printing process is not suitable for mass production methods as it is not highly reproducible. A further disadvantage of the contact printing method is the need for the longitudinal grooves in the viewing surface of the screen in order that all of the non-lighted areas of the screen be contact with ink to produce the black matrix. For these reasons, a photolithographic method as described would be particularly desirable for use in providing a black matrix on a rear-projection TV viewing screen formed of a methyl methacrylate polymer substrate.

SUMMARY OF THE INVENTION

A principal object of this invention is to provide an improved aqueous polyvinyl alcohol photoresist composition particularly adapted to the formation of photoresists on methacrylate polymer substrates.

Another object of this invention is directed to an improved method for providing a methacrylate polymer substrate with a photosensitive layer particularly a negative-acting photosensitive layer.

Still another object of the instant invention is directed to an improved method of forming a black, light-absorbing matrix on the viewing surface of a translucent methyl methacrylate polymer rear-projection television screen.

These and other objects of the invention will be apparent from the description that follows:

According to one aspect of the invention, the applicant has found that the ability of an aqueous polyvinyl alcohol photoresist composition substantially free of wetting agents to wet the surface of a methacrylate polymer substrate may be significantly improved by the addition to the solution of 5–20% by volume of an aliphatic ketone having a boiling point below 130° C.

The resultant novel photoresist composition has been found to wet the surface of methacrylate polymer substrates completely and uniformly thus allowing the formation of a uniform light-sensitive layer on a methyl methacrylate polymer substrate.

Further, since the ketone is removed by drying, essentially no material that serves as a wetting agent is left in the exposed and unexposed portions of the light-sensitive layer after exposure thus eliminating the problem of the undesired loss, during water development, of parts of the hardened and supposedly water insoluble portions of the photoresist layer.

As a result, sharp, well-defined hardened water-insoluble polyvinyl alcohol patterns may be readily formed on methacrylate polymer substrates.

Another aspect of the invention relates to a novel method of providing a black light-absorbing matrix on the viewing surface of a translucent methyl methacrylate polymer rear-projection television viewing screen. This method is particularly adapted for use on those rear-projection television screens the projection surfaces of which are formed of a series of adjacent lenticules. Due to the presence of these lenticules, exposure of the projection surface to visible light or ultra-violet light radiation causes a series of light and dark areas to appear on the viewing surface of the screen thus allowing the screen itself to function as a light radiation mask.

The lenticules may be longitudinal, curved or round or another convenient shape. When the lenticules are longitudinal and are located essentially parallel to each other a series of essentially parallel rows of alternatively dark and light areas are formed on the viewing surface of the screen.

According to the invention a black light-absorbing matrix is provided on the viewing surface of such a screen in the following manner:

The viewing surface of a translucent methacrylate polymer such as a polymethyl methacrylate for example, a Plexiglas rear-projection television screen, the projection surface of which is covered with adjacent lenticules, is provided with a thin negative-acting photosensitive layer of the aqueous polyvinyl alcohol photosensitive composition of the invention. The layer is dried at room temperature for about 15–100 seconds to remove sufficient water to cause the photosensitive layer to become immobile. The projection surface of the screen is then exposed to ultraviolet radiation thus causing a series of alternating light and dark areas to appear on the viewing surface of the screen, as a result of which the portions of the photosensitive layer in the light areas are exposed to the ultraviolet radiation while those portions of the photosensitive layer in the dark areas are unexposed; each of the exposed areas corresponds to an area where it is desired that an image appear on the viewing surface.

The screen is exposed to the ultraviolet radiation until the exposed areas of the immobile photosensitive layer becomes water-insoluble. The thus exposed layer is then developed with water as a result of which only a thin pattern of the polyvinyl alcohol layer corresponding to the desired image containing areas is left attached to the viewing surface of the screen.

A thin layer of an aqueous suspension of colloidal carbon such as an aqueous suspension of graphite, is then applied to the polyvinyl alcohol pattern. The thin layer of the aqueous suspension of the colloidal carbon is then dried thus forming a carbon surface on the viewing surface of the screen.

The thin carbon layer is then developed with hydrogen peroxide which results in the removal of the thin pattern of polyvinyl alcohol and the overlying carbon layer thus leaving attached to the exposed areas of the viewing surface of the screen a carbon pattern. As a result, the viewing surface is provided with with a black, light-absorbing matrix surrounding the areas of the viewing surface designated for image containing.

This novel method of providing the light-absorbing matrix has the following advantages over that of the contact printing method of the prior art.

The instant method is reproducible to a much greater degree than the contact printing method, thus, unlike the contact method, being well-suited for mass production. Further, unlike the contact printing method where irregular edges of the black matrix areas are formed the instant method results in the formation of black matrix areas with straight edges. As a result, there is a greater control of the boundaries of the matrix image containing areas and the formation of more uniform black matrix areas. In addition, while the contact printing method requires that the viewing surface be grooved, for the instant method the viewing surface need not be grooved.

DESCRIPTION OF THE PREFERRED EMBODIMENTS

While water alone may be employed as the solvent, the addition of an aliphatic alcohol of 1–3 carbon atoms in an amount of up to 20% by volume has been found to reduce the tendency of the polyvinyl alcohol solution to form bubbles when the solution is poured or spread.

Alcohols, such as methanol, ethanol and propanol may all be employed. However, superior results have been found to be achieved with the use of methanol in a concentration by volume of 5–20% with best results being achieved with the methanol present in a concentration of about 15–16% by volume.

Examples of the aliphatic ketone that may be employed are acetone, 2-butanone, 2-pentanone and 3-pentanone. Of these, acetone is preferred because of its low cost, ready availability and low boiling point. While good results may be achieved with a ketone concentration of 5–20% by volume, superior results are achieved when the ketone employed is acetone in a concentration of 10–15% by volume preferably in a concentration of about 10% by volume.

While any of the photosensitizers known for use with polyvinyl alcohol may be used, such as diazo compounds and the water-soluble dichromates the dichromates are preferred because of their low cost and greater availability.

Examples of the dichromates that may be employed are ammonium dichromate, sodium dichromate and potassium dichromate. Of these, ammonium dichromate is preferred. Effective concentrations of the dichromates are in the range of 0.05–0.5% by weight.

The photoresist composition of the invention may be employed with any methacrylate polymer substrate such as polymethyl methacrylate or polyethyl methacrylate.

For greater understanding the invention will now be disclosed in greater detail with reference to the drawings and the following example:

I. Photoresist Composition

A negative-working photoresist composition was prepared by mixing together the following ingredients:

| PVA Stock (6%)* | 50 ml |
|---|---|
| Methanol | 35 ml |
| ADC** | 3 ml |
| Acetone | 22 ml |
| $H_2O$ D.I. | 112 ml |

*PVA Stock - 6% aqueous solution of polyvinyl alcohol (Monsanto type 20–40)
**ADC - $(NH_4)_2CR_2O_7$  9.7 g
$H_2O$ D.I.  90.3 ml A 30–40 inch viewing surface of a Plexiglass rear-projection TV viewing screen, the projection surface of which was covered with adjacent longitudinal lenticules each about 40 mils in width, was coated with the photoresist composition described above and the resultant coating was air dried to cause it to become immobile.

Figure 1:
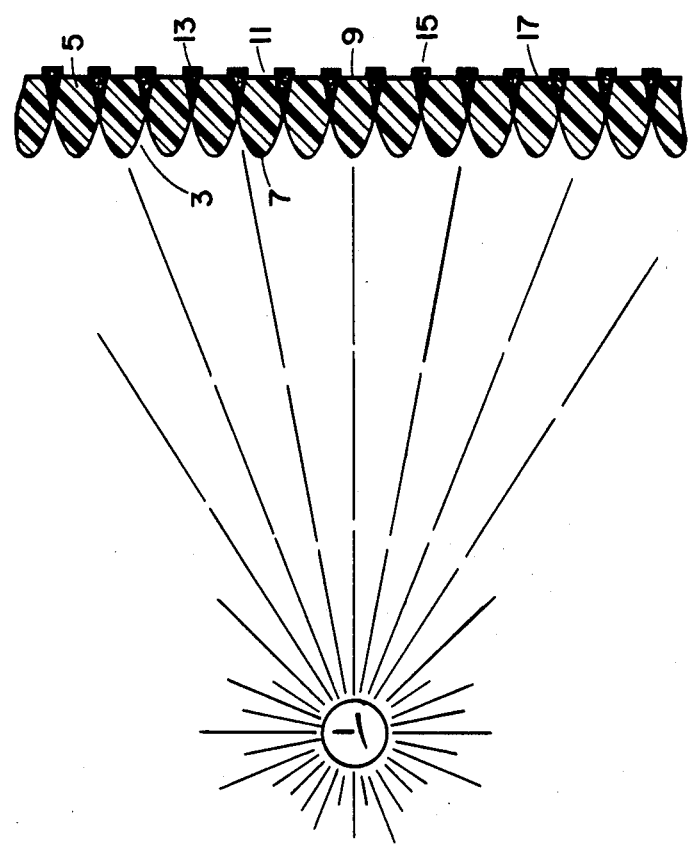
FIG. 1 is a schematic showing the structure and focusing characteristics of a rear-projection TV screen, the projection surface of which is formed of a series of adjacent parallel longitudinal lenticules and the viewing surface of which is formed of a series of adjacent longitudinal grooves, the ridges of which correspond to the non-light focusing sections of the lenticule.

The structural and light-focusing characteristics of this TV viewing screen are schematically shown in FIG. 1 of the drawing.

As shown, visible light or ultraviolet radiation from a light source 1 was projected onto the lenticule covered projection surface 3 of a plexiglass rear-projection TV viewing screen 5 (shown in cross-section), each of the lenticules 7 being adjacent and parallel to each other, longitudinal in shape and having a width of about 40 mils. The viewing surface 9 of the screen 5 comprises a series of parallel longitudinal grooves 11, each groove 11 corresponding in position to a lenticule 7. Due to the focusing characteristics of the lenticules, dark areas 13 appear on the ridges 15 between the grooves 11 in the viewing surface while light areas 17 appear in the grooves themselves.

Figure 2:
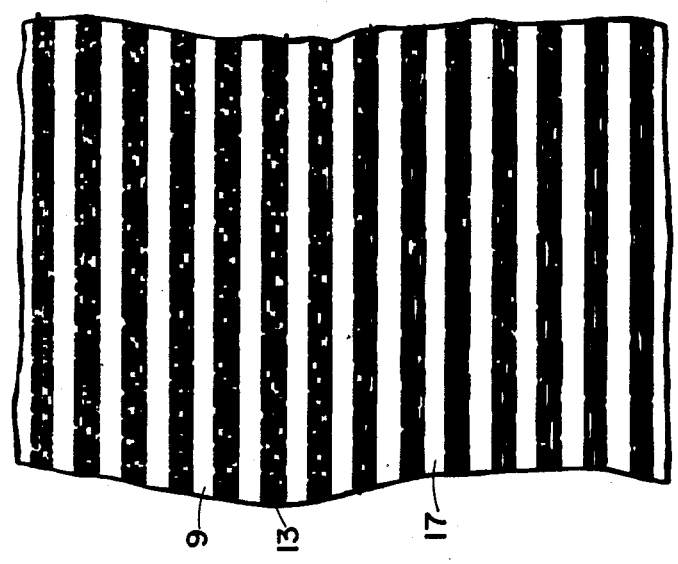
FIG. 2 is a top view of the viewing surface of the screen shown in FIG. 1.

As shown in FIG. 2, a top view of a corresponding section of the viewing surface 9, the dark areas 13 and the light areas 17 appear as alternate parallel dark and light longitudinal areas on the viewing surface.

The projection surface 3 was then exposed to ultraviolet radiation from an ultraviolet light source 1 (for for example, a mercury short arc lamp, type (202/203) from Illumination Industries, Inc. 825 East Evelyn Avenue, Sunnyvale, Calif. 94086), the resultant dark areas 13 acting to mask from ultraviolet radiation any of those portions of a photoresist coating that were present in such dark areas while those portions of a photoresist coating that were present in the light areas 17 were exposed to the ultraviolet radiation.

Water development of the exposed coating was then carried out by subjecting the coating to several passes of water from a water jet. As a result, portions of the coating which had been in the dark areas 13 and therefore had not been hardened and had not become water-insoluble were removed by the water development rinse while those portions of the coating which had been in the light areas 17 and which therefore had been hardened and had become water-insoluble remained. Thereby there was formed a hardened polyvinyl alcohol relief image in the form of alternating coated and uncoated parallel longitudinal areas of the viewing surface, the boundaries of which areas were sharp and regular.

An aqueous graphite slurry was prepared by mixing together the following ingredients:

| Aquadag E* | 68 ml |
|---|---|
| Acrysol stock** | 23 ml |
| Ethylene Glycol | 1 ml |
| $H_2O$, D.I. | 216 ml |

*Aquadag E - 22% aqueous suspension of colloidal graphite of particle size of less than 1 μm - sold by Acheson Colloids
**Acrysol stock - Acrysol G110 (ammonium polyacrylate) - sold by Rohm & Haas - 10 g plus $H_2O$ D.I. -176 g This graphite slurry was then flowed onto the previously obtained hardened polyvinyl alcohol relief image on the viewing surface and the resultant black coating was air dried.

Figure 3:
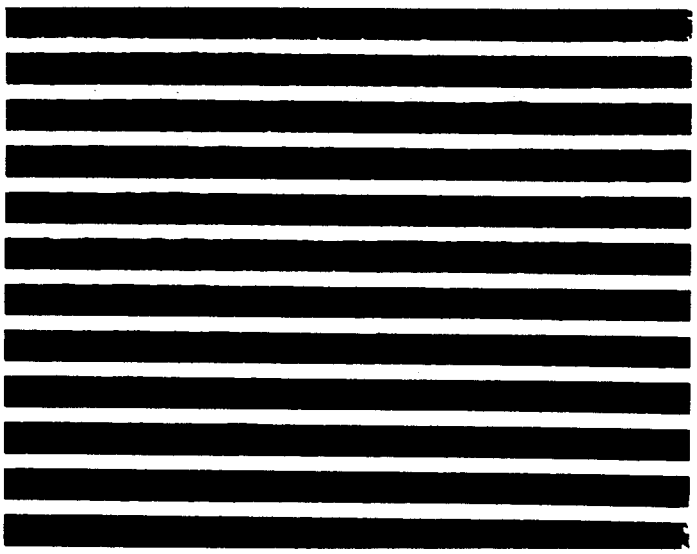
FIG. 3 is a photograph enlarged 7 times, of a section of a grooved viewing surface of a similar TV viewing screen, the viewing surface of which is supplied with a black matrix by means of the photolithographic process of the invention.

The black coating was then developed with a 20% hydrogen peroxide solution at room temperature. The development with the hydrogen peroxide caused the hardened polyvinyl alcohol and overlying portions of the black coating to be loosened and separated from the viewing surface leaving behind a black light-absorbing matrix directly attached to the viewing surface in the form of parallel alternate black light-absorbing stripes separated by parallel sections of uncoated viewing surface or windows, each stripe and one adjoining window having a width of about 40 mils. The boundaries between the black stripes and the adjacent uncoated sections of the viewing surface were sharp and regular. This is clearly shown in FIG. 3 which is a photograph, enlarged 7 times, of a section of a viewing surface provided with the black matrix formed above.

Figure 4:
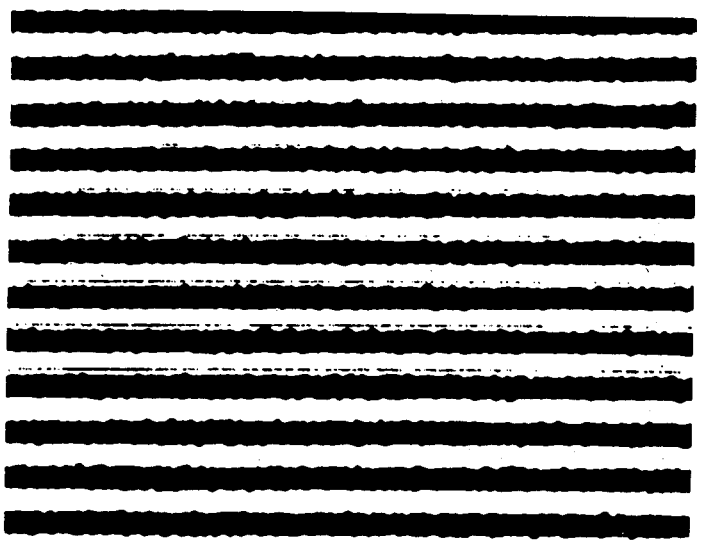
FIG. 4 is a photograph, similarly enlarged, of a section of a grooved viewing surface of polymethyl methacrylate TV viewing screen such as shown in FIG. 1, the viewing surface of which is supplied with a black, light-absorbing matrix, by means of a contact printing process of the prior art.

FIG. 4 which is a photograph of a section, similarly enlarged, of a grooved viewing surface provided with a black matrix by means of a contact printing process of the prior art shows that the boundaries between the adjacent coated and uncoated viewing surfaces are irregular and scalloped shaped with the sections of the black matrix being of varying size.

Figure 5:
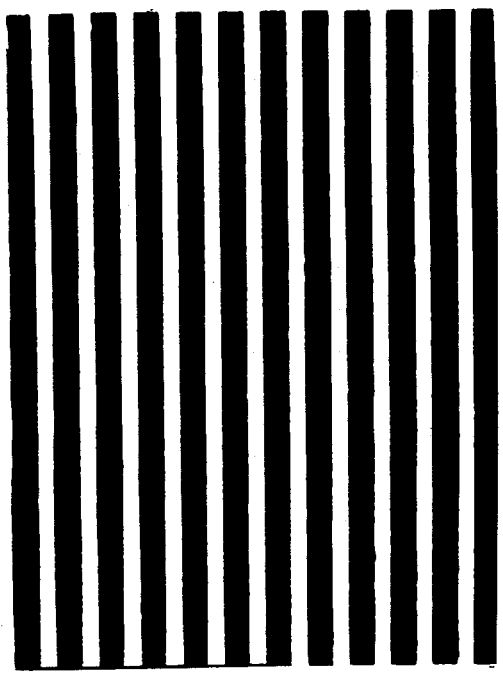
FIG. 5 is a photograph of a section, similarly enlarged, of a flat viewing surface of a polymethyl methacrylate viewing screen, the viewing surface of which has been supplied with a black matrix by the photolithographic process of the invention.

FIG. 5 which is a photograph similar to that of FIG. 2, of a black matrix formed on a flat viewing surface by the method of the invention shows that even on such a surface a sharply defined black matrix may be formed by the photolithographic method of the invention.

It will be apparent that various modifications may be made to the present invention without departing from its scope as defined by the following claims.

What is claimed is:

1. A method of providing the viewing surface of a translucent methyl methacrylate polymer rear-projection television screen with a black light-absorbing matrix, said screen being provided with two, essentially parallel, major surfaces, one of said two surfaces, the projection surface, being formed of a series of contiguous lenticules, said lenticules when subjected to light radiation causing a series of alternating light and dark areas to appear on the remaining major surface of said screen, the viewing surface, each of said light areas corresponding to the center of a lenticule, said method comprising:

(a) forming, on the viewing surface of said translucent methyl methacrylate polymer television screen, a thin aqueous negative-acting photosensitive polyvinyl alcohol layer consisting of an aqueous solution of polyvinyl alcohol, a water-soluble light-sensitive dichromate, as a water-soluble photosensitive for said polyvinyl alcohol up to 20% by volume of an aliphatic alcohol of 1-3 carbons and, as essentially the sole wetting agent, 5-20% by volume of an aliphatic ketone having a boiling point below 130° C., (b) drying said thin photosensitive aqueous polyvinyl alcohol layer at room temperature for 15-100 seconds to remove sufficient water to cause said thin photosensitive polyvinyl alcohol layer to become immoble, (c) exposing the projection surface of said screen produced with said lenticules to ultraviolet radiation thus causing a series of essentially parallel light and dark areas to be formed on the viewing surface of said screen, only the areas of said photosensitive polyvinyl alcohol layer in said light areas being thus exposed to ultraviolet radiation, each of said exposed areas of said photosensitive polyvinyl alcohol layer corresponding to a desired image containing area, said exposure being continued for a time sufficient to cause said exposed areas of said photosensitive polyvinyl alcohol layer to become water insoluble, (d) treating said thin polyvinyl alcohol layer with water to thereby remove the unexposed areas of said thin polyvinyl alcohol layer from said viewing surface and leave attached thereto a thin pattern of said polyvinyl alcohol layer corresponding to desired image containing areas;

(e) applying to said viewing surface containing said thin pattern a thin layer of an aqueous suspension of colloidal carbon;

(f) drying said thin layer of said aqueous suspension of colloidal carbon thereby forming a thin carbon layer on said viewing surface;

(g) developing said thin carbon layer with hydrogen peroxide to thereby remove said thin pattern of polyvinyl alcohol and only the overlying portions of said carbon layer from said viewing surface thereby providing said viewing surface with a black, light-absorbing, matrix surrounding the areas of said viewing surface designated for image containing.

2. The method of claim 1 wherein the aqueous solution contains 10-15% by volume of acetone.

3. The method of claim 2 wherein the aqueous solution contains from 0.05-0.5% by weight of sodium dichromate, potassium dichromate or ammonium dichromate and a 0.5-3% by weight of the polyvinyl alcohol.

4. The method of claim 3 wherein the aqueous solution contains about 1.3-1.5% by weight of said polyvinyl alcohol being 85.5-88.7% hydrolyzed polyvinyl alcohol of an average molecular weight of about 124,000-126,000, about 10% by volume of acetone, about 0.13-0.15% by weight of ammonium dichromate and about 15-16% by volume of methanol.

5. The method of claim 1 wherein the lenticules are contiguous parallel longitudinal lenticules and alternating parallel rows of light and dark areas are caused to appear on the viewing surface of the screen.

* * * * *